United States Patent [19]
Yang et al.

[11] Patent Number: 5,698,460
[45] Date of Patent: Dec. 16, 1997

[54] METHOD OF SELF-ALIGNING AN EMITTER CONTACT IN A PLANAR HETEROJUNCTION BIPOLAR TRANSISTOR AND APPARATUS THEREOF

[75] Inventors: Jau-Yuann Yang, Richardson; Donald L. Plumton, Dallas; Francis J. Morris, Plano, all of Tex.

[73] Assignee: Texas Instruments Incorporated, Dallas, Tex.

[21] Appl. No.: 480,290

[22] Filed: Jun. 7, 1995

Related U.S. Application Data

[62] Division of Ser. No. 230,194, Apr. 20, 1994.

[51] Int. Cl.$^6$ ................................................. H01L 21/265
[52] U.S. Cl. .............................. 437/31; 437/32; 437/126; 437/133; 148/DIG. 10; 148/DIG. 72
[58] Field of Search ........................... 437/31, 32, 126, 437/133; 148/DIG. 10, DIG. 72

[56] References Cited

U.S. PATENT DOCUMENTS

| | | | |
|---|---|---|---|
| 4,529,996 | 7/1985 | Pande | 357/16 |
| 4,683,487 | 7/1987 | Ueyanagi et al. | 357/34 |
| 4,728,616 | 3/1988 | Ankin et al. | 437/133 |
| 5,068,756 | 11/1991 | Morris et al. | 357/16 |
| 5,077,231 | 12/1991 | Plumton et al. | 437/51 |
| 5,166,081 | 11/1992 | Inada et al. | 437/133 |
| 5,243,207 | 9/1993 | Plumton et al. | 257/192 |
| 5,262,335 | 11/1993 | Streit et al. | 437/31 |
| 5,436,181 | 7/1995 | Morris et al. | 437/31 |

FOREIGN PATENT DOCUMENTS

| | | | |
|---|---|---|---|
| 0 416 166 A1 | 8/1989 | European Pat. Off. | H01L 29/73 |

OTHER PUBLICATIONS

Yamasaki, et al., "GaAs LSI–Directed MesFet's With Self–Aligned Implantation for $n^{3o}$–Layer Technology (Saint)," *IEEE Transaction on Electron Devices*, vol. ED–29, No. 11, Nov. 1982, pp. 1772–1777.

Shikata, et al., "A Novel Self-Aligned Gate Process for Half–Micrometer Gate GaAs IC's Using ECR–CVD," *IEEE Transaction on Electron Devices*, vol. 37, No. 8, Aug. 1990, pp. 1800–1803.

*Primary Examiner*—Tuan H. Nguyen
*Attorney, Agent, or Firm*—Christopher L. Maginniss; James C. Kesterson; Richard L. Donaldson

[57] ABSTRACT

A self-aligned planar heterojunction bipolar transistor (10) is fabricated by forming a base layer (18) and forming an emitter layer (20) on the base layer (18). An emitter cap layer (22) is formed on the emitter layer (20) and an interface layer (24) is formed on the emitter cap layer (22). A first implantation layer (26) is formed through the interface layer (24), the emitter cap layer (22), and the emitter layer (20) to the base layer (18). A second implantation layer (30) is formed through the interface layer (24), the emitter cap layer (22), and the emitter layer (20) to the base layer (18) and overlaps the first implantation layer (26). A portion of the interface layer (24), the emitter cap layer (22), and the implantation layers (26, 30) are removed and replaced by an insulating region (33). An emitter contact (38) is formed on the remaining emitter cap layer (22) and is isolated from the implantation layers (26, 30) by the insulating region (33). The insulating region (33) acts as a buffer to self-align the emitter contact (38) to the implantation layer (26, 30).

11 Claims, 2 Drawing Sheets

METHOD OF SELF-ALIGNING AN EMITTER CONTACT IN A PLANAR HETEROJUNCTION BIPOLAR TRANSISTOR AND APPARATUS THEREOF

This is a divisional of application Ser. No. 08/230,194, filed Apr. 20, 1994.

TECHNICAL FIELD OF THE INVENTION

The present invention relates in general to semiconductor fabrication processes and more particularly to a method of self-aligning an emitter contact in a planar heterojunction bipolar transistor and apparatus thereof.

BACKGROUND OF THE INVENTION

For continued improvements in maximum operating frequencies for gallium arsenide integrated circuits, heterojunction bipolar transistors must be scaled down to reduce parasitic capacitances. Reducing the size of the heterojunction bipolar transistor results in misalignment problems of the emitter contact. These misalignment problems are tolerated in conventional heterojunction bipolar transistors, but result in shorting between the emitter and the base as the transistor size decreases.

One method of preventing misalignment problems is a self-aligned implanted transistor process suitable for metal semiconductor field effect transistor (MESFET) structures. However, this self-aligned MESFET process is not capable of making a heterojunction bipolar transistor. In fabricating a heterojunction bipolar transistor using the self-aligned MESFET-like process, a critical etch down to the base is required for the base contact resulting in a non-planar structure. If the self-aligned MESFET-like process is used without an etch down to the base for the base contact, then another etch is necessary between the extrinsic base implant and the emitter region. This alternative etch eliminates the emitter cap layer between the emitter and the base, thus eliminating the parasitic homojunction diode provided by the emitter cap layer. With the parasitic homojunction diode effect, the current gain of the transistor is degraded at low collector current density. Therefore, it is desirable to fabricate a planar heterojunction bipolar transistor that avoids mis-aligning the emitter contact and eliminates unnecessary etching steps.

SUMMARY OF THE INVENTION

From the foregoing, it may be appreciated that a need has arisen for a planar heterojunction bipolar transistor that avoids misalignment problems in the placement of the emitter contact. A need has also arisen for a planar heterojunction bipolar transistor that has the emitter contact self-aligned to the extrinsic base region. Further, a need has arisen for a planar heterojunction bipolar transistor that does not have a degraded transistor current gain as a result of unnecessary etching steps.

In accordance with the present invention, a method of self-aligning an emitter contact in a planar heterojunction bipolar transistor and apparatus thereof are provided which substantially eliminate or reduce disadvantages and problems associated with other heterojunction bipolar transistor fabrication processes.

According to an embodiment of the present invention, there is provided a method of self-aligning an emitter contact in a planar heterojunction bipolar transistor that includes forming a base layer and forming an emitter layer on the base layer. An emitter cap layer is formed on the emitter layer and an implantation layer is formed through a selected portion of the emitter layer and the emitter cap layer to the base layer. An insulating layer is formed adjacent to the implantation layer, separating the implantation layer from the emitter cap layer. An emitter contact is formed on the emitter cap layer such that the emitter contact is self-aligned to the implantation layer.

The method and apparatus of the present invention provides various technical advantages over other planar heterojunction bipolar transistor fabrication processes. For example, one technical advantage is in fabricating a planar heterojunction bipolar transistor that overcomes misalignment problems in the placement of the emitter contact. Another technical advantage is in self-aligning the emitter contact to the implantation layer. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

FIGS. 1A–1E show the process steps in fabricating a self-aligned planar heterojunction bipolar transistor 10. The process steps that follow describe fabrication of an NPN device and can be readily adapted to fabrication of a PNP device. Further, gallium arsenide is shown and described as the primary material for each layer but other materials from Group III and Group V of the Periodic Table may be substituted.

Figure 1A:
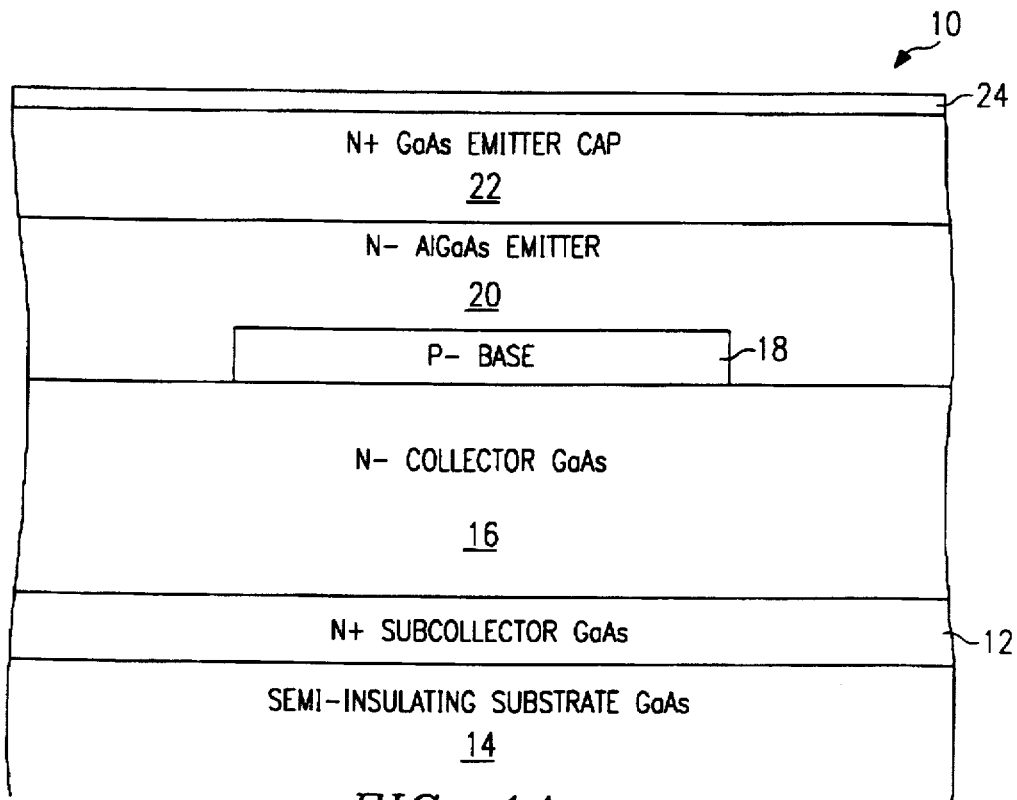
FIGS. 1A–1E illustrate a fabrication process for a planar heterojunction bipolar transistor.

The process begins in FIG. 1A where a subcollector layer 12 having an N+ conductivity type is epitaxially grown on a substrate layer 14. A collector layer 16 having an N− conductivity type is epitaxially grown onto subcollector layer 12. A base layer 18 having a P-conductivity type is epitaxially grown onto collector layer 16 and selectively removed such that base layer 18 covers a portion of collector layer 16. An emitter layer 20 having an N− conductivity type is epitaxially grown onto collector layer 16 and base layer 18. An emitter cap layer 22 having an N+ conductivity type is epitaxially grown onto emitter layer 20. An interface layer 24 is deposited onto emitter cap layer 22.

Figure 1B:
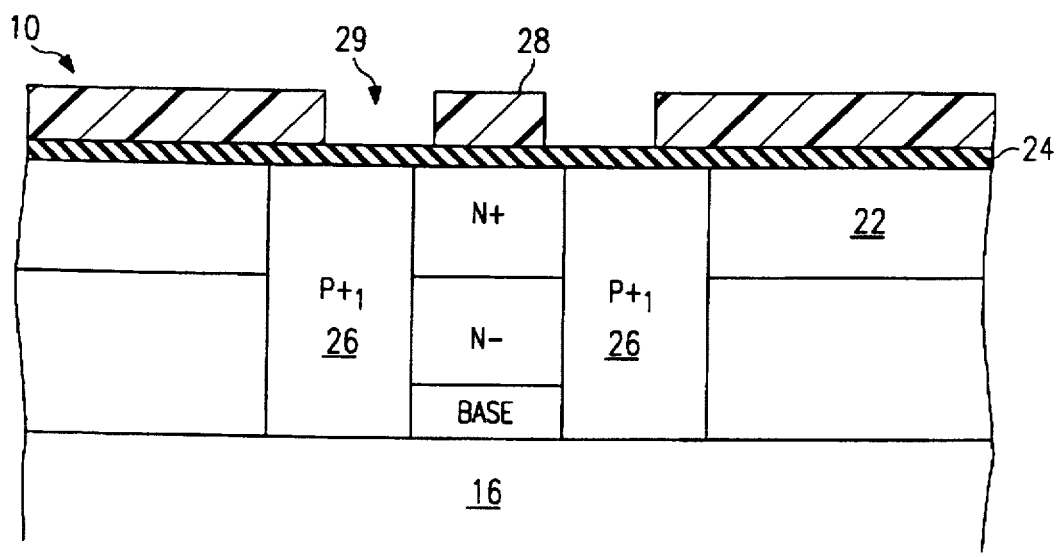

The process continues in FIG. 1B where a first implantation layer 26 is formed through interface layer 24, emitter cap layer 22, and emitter layer 20 to base layer 18. First implantation layer 26 has a P+ conductivity type to correspond with base layer 18. A photoresist etch layer 28 is patterned onto interface layer 24.

Figure 1C:
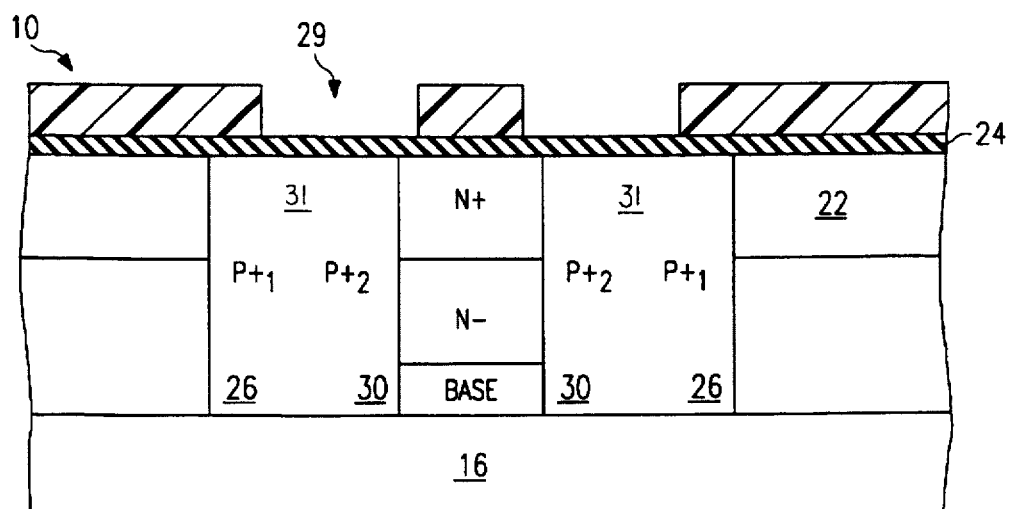

The process continues in FIG. 1C where a second implantation layer 30 is formed within the selected openings 29 of photoresist etch layer 28. Second implantation layer 30 overlaps first implantation layer 26 to form an implantation region 31 and is of the same P+ conductivity type as first implantation layer 26. Implantation region 31 is now an extrinsic base for transistor 10. Photoresist etch layer 28 is ashed back to increase the size of selected opening 29.

Figure 1D:
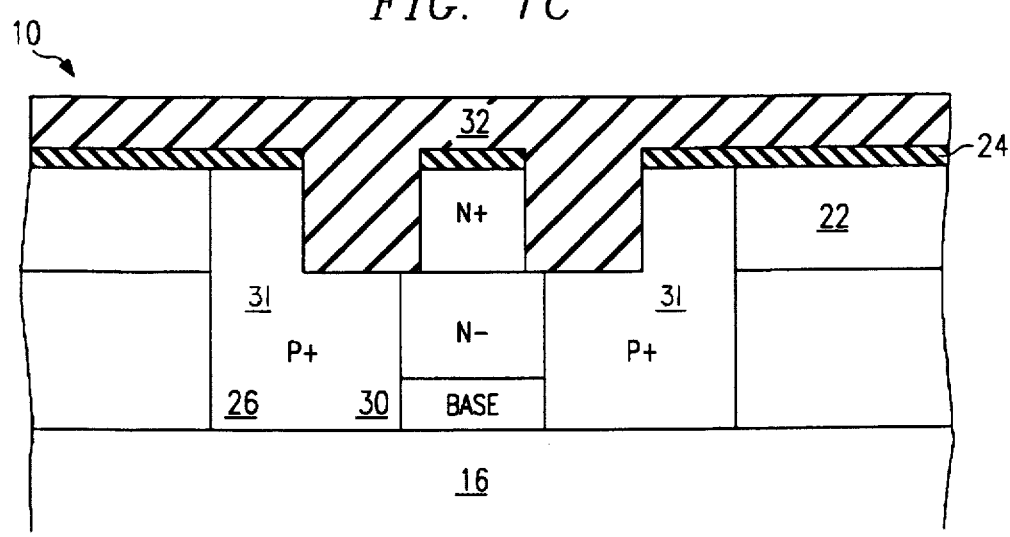

The process continues in FIG. 1D where portions of interface layer 24, emitter cap layer 22, and implantation region 31 corresponding to opening 29 are etched away. An insulating layer 32 is anisotropically deposited onto planar heterojunction bipolar transistor 10. Insulating layer 32 is preferably made of a silicon nitride $Si_3N_4$.

Figure 1E:
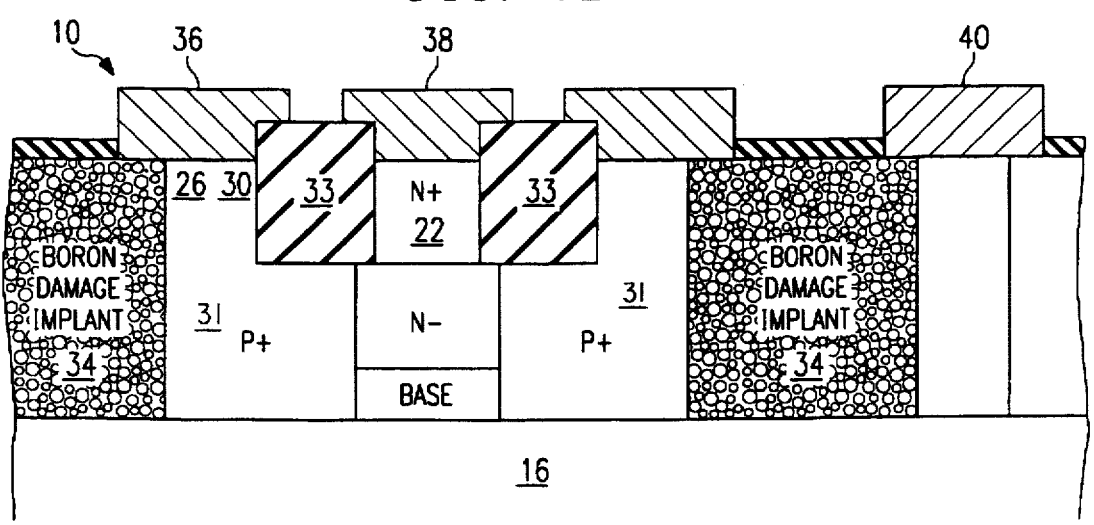

The process continues in FIG. 1E where insulating layer 32 is selectively lifted off to leave an insulating region 33 in the area created at opening 29. Boron damage implants 34 are formed to isolate planar heterojunction bipolar transistor 10. Interface layer 24 is selectively removed to allow formation of a base contact 36 onto implantation region 31 and an emitter contact 38 onto emitter cap layer 22. Emitter contact 38 is isolated from base contact 36 and implantation region 31 by insulating region 33. This isolation allows for the emitter contact to be oversized larger than the remaining emitter area of emitter cap layer 22, allowing emitter contact 38 to be self-aligned to implantation region 31.

A collector contact 40 is subsequently formed for connection to subcollector layer 12 through collector layer 16. Each contact lies along a singular plane to give heterojunction bipolar transistor 10 its planar aspect. Planar heterojunction bipolar transistor 10 has improved current gain and enhanced high frequency performance through increases in the threshold frequency and the maximum frequency characteristics.

In summary, a planar heterojunction bipolar transistor has an emitter contact that is self-aligned to the extrinsic base region. This self-alignment overcomes misalignment problems during the placement of the emitter contact by ensuring that an insulating region separates the emitter contact from the extrinsic base region. Improved transistor performance characteristics are also achieved through this self-aligned technique.

Thus, it is apparent that there has been provided in accordance with the present invention, a method of self-aligning an emitter contact in a planar heterojunction bipolar transistor and apparatus thereof that satisfy the advantages set forth above. Although the preferred embodiment has been described in detail, it should be understood that various changes, substitutions, and alterations can be made herein. For example, process steps and process materials may be altered while maintaining the self-aligned planar nature of the heterojunction bipolar transistor. Other examples are readily ascertainable by one skilled in the art and could be made without departing from the spirit and scope of the present invention as defined by the following claims.

What is claimed is:

1. A method of self-aligning an emitter in a heterojunction bipolar transistor, comprising the steps of:

forming a base layer onto a collector layer;
   forming an emitter layer onto said base layer;
   forming an emitter cap layer onto the emitter layer;
   forming a first implantation layer to the base layer through the emitter cap layer and the emitter layer;
   forming a second implantation layer to the base layer through a selected portion of the emitter cap layer and the emitter layer, the second implantation layer overlapping the first implantation layer to form an implantation region;
   forming an insulating region by removing a portion of the emitter cap layer and the implantation region to leave an opening and placing an insulating material in the opening;
   forming an emitter contact on the emitter cap layer, the insulating region separating the emitter contact from the implantation region.

2. The method of claim 1, wherein said base layer, said emitter layer, and said emitter cap layer are formed from materials that include elements within Groups III and V of the periodic table.

3. The method of claim 2, wherein the elements are gallium and arsenic.

4. The method of claim 1, wherein the insulating material comprises silicon nitride.

5. The method of claim 1, wherein the insulating region is formed in a larger opening than the selected portion for the second implantation layer.

6. The method of claim 1, further comprising the steps of:
   forming a base contact on the implantation region;
   forming a collector contact to the collector layer such that the emitter contact, the base contact, and the collector contact lie on a same plane.

7. The method of claim 6, further comprising the step of:
   forming a damage implant region to isolate the collector contact from the base contact and the emitter contact and isolate the transistor from other devices.

8. A method of self-aligning an emitter contact in a planar heterojunction bipolar transistor, comprising the steps of:

growing a base layer having a first conductivity type onto a collector layer having a second conductivity type;
   etching the base layer away from the collector layer such that the base layer covers a portion of the collector layer;
   growing an emitter layer having the second conductivity type onto the base layer and the collector layer;
   growing an emitter cap layer having the second conductivity type onto the emitter layer;
   depositing an interface layer onto the emitter cap layer;
   implanting a first implantation layer having the first conductivity type to the base layer through the interface layer, the emitter cap layer, and the emitter layer;
   placing a photoresist layer onto the interface layer, the photoresist layer having an opening;
   implanting a second implantation layer having the first conductivity type into the opening such that the implantation layer comes in contact with the base layer through the interface layer, the emitter cap layer, and the emitter layer, the second implantation layer overlapping the first implantation layer to form an implantation region;
   ashing back the photoresist layer to enlarge the opening;
   etching away portions of the emitter cap layer and the implantation region from the opening;
   removing the photoresist layer;
   depositing an insulating layer onto the interface layer and within the opening;
   lifting off portions of the insulating layer to leave an insulating region within the opening;
   etching away the interface layer from the emitter cap layer;
   depositing an emitter contact onto the emitter cap layer and the insulating region, the insulating region preventing the emitter contact from coming in contact with the implantation region.

9. The method of claim 8, further comprising the steps of:
   etching away the interface layer from the implantation region and a collector contact point;

depositing a base contact onto the implantation region and the insulating region;

forming a collector plug to the collector layer at the collector contact point;

depositing a collector contact onto the collector plug such that the collector contact, the base contact, and the emitter contact lie on a same plane.

10. The method of claim 8, further comprising the step of:

implanting a boron damage implant region to the collector layer to isolate the transistor from other devices and isolate the collector contact from the base and emitter contacts.

11. The method of claim 8, wherein the insulating layer is formed with silicon nitride.

* * * * *